United States Patent [19]

Szabo

[11] Patent Number: 4,541,120
[45] Date of Patent: Sep. 10, 1985

[54] TRANSMITTER-RECEIVER MODULE
[75] Inventor: Laszlo Szabo, Korntal, Fed. Rep. of Germany
[73] Assignee: International Standard Electric Corporation, New York, N.Y.
[21] Appl. No.: 523,545
[22] Filed: Aug. 16, 1983
[30] Foreign Application Priority Data Aug. 19, 1982 [DE] Fed. Rep. of Germany ....... 3230832

[51] Int. Cl.³ .............................................. H04B 1/40
[52] U.S. Cl. ........................................ 455/86; 455/81; 455/327; 455/328; 331/107 SL; 333/116
[58] Field of Search ..................... 455/80, 81, 86, 327, 455/328; 331/107 DP, 107 SL; 333/109, 116, 112, 122, 246; 332/30 V; 343/700 MS

[56] References Cited

U.S. PATENT DOCUMENTS

| | | | |
|---|---|---|---|
| 3,996,529 | 12/1976 | Curtice | 331/107 SL |
| 4,087,751 | 5/1978 | Kato et al. | 455/81 |
| 4,259,743 | 3/1981 | Kaneko et al. | 455/81 |
| 4,276,655 | 6/1981 | Kraemer et al. | 333/246 |
| 4,426,628 | 1/1984 | Malecki et al. | 331/107 SL |

OTHER PUBLICATIONS

"Octave-Band Fin-Line Hybrid" by Hennawy et al., Conference: Proc. of 11th European Microwave Conference, Amsterdam, Netherlands, Sep. 7-11, 1981.
"Advances in Printed Millimeter-Wave Osc. Circuits" by Cohen, 1980, IEEE MTT-S, International Microwave Symp. Digest, May 20-30, 1980.
"94 GHz Bal. Fin Line Mixer" by Menzel et al., Electronics Letters, vol. 18, No. 1, 1/7/1982.
"The Vivaldi Aerial" by Gibson, Conference: Proc. of the 9th European Microwave Conference, Brighton, England, Sep. 17-20, 1979.

Primary Examiner—Jin F. Ng
Attorney, Agent, or Firm—John T. O'Halloran; Peter R. Ruzek

[57] ABSTRACT

The transmitter-receiver module includes a four-terminal coupler (2). An oscillator (1) and two diodes (4, 4') are connected to three of the terminals, while the fourth is connectable to an antenna (3). The diodes are used as a modulator during transmit, and as a mixer during receive. When transmitting, the oscillator is used as a signal source, and when receiving, it is used as a local oscillator. The module is implemented using fin-line technology. Several ways of realizing the oscillator are given.

7 Claims, 9 Drawing Figures

TRANSMITTER-RECEIVER MODULE

The present invention relates to a transmitter-receiver module as shown in FIG. 1. A transmitter-receiver module of this kind is disclosed in an article by Y. Matsuo et al, "A Compact 60-GHz Transmitter-Receiver" published in IEEE Transations on Microwave Theory and Techniques, Vol. MTT-24, No. 11, November 1976 on pages 794–797.

During the realization of such a transmitter-receiver for frequencies in the GHz range, various problems are encountered, particularly with respect to good reproducibility, because during quantity production, manufacturing tolerances must be kept very small.

The novel transmitter-receiver module is very well suited for quantity production. It is relatively insensitive to manufacturing variations, can be made at low cost, and occupies very little space.

The invention will now be explained in more detail, by way of example, with reference to the accompanying drawings, in which.

Figures 6, 7:
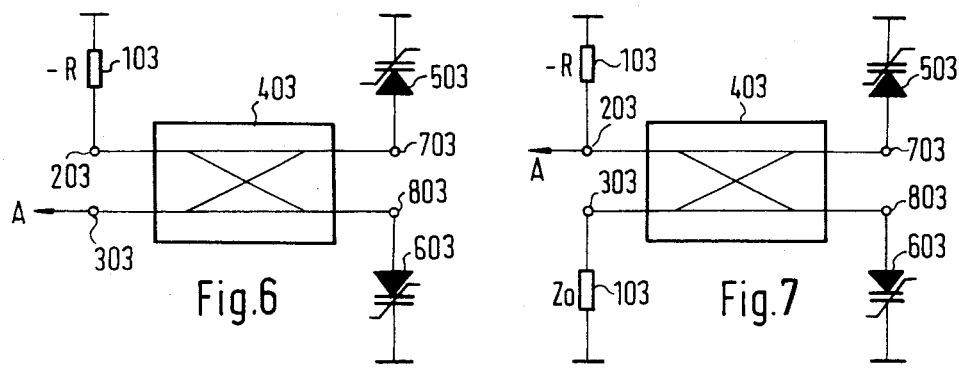

FIGS. 4a, 4b, 5a, and 5b show embodiments of oscillators for the transmitter-receiver module, and FIGS. 6 and 7 are block diagrams of oscillators which are especially suited for implementation in fineline form.

First, the known transmitter-receiver module will be explained with the aid of the block diagram of FIG. 1.

There is provided a coupler 2, implemented as a 3-dB-hybrid. The same results are achieved if the coupler is replaced with a magic T. The coupler has four terminals. A first terminal is connected to an oscillator 1, the second to an antenna 3, and the two remaining terminals are connected to diodes 4 and 4', respectively. The diodes have one end connected to an IF amplifier stage 5 and the other to a driver stage 6. During transmit, the oscillator 1 works as a transmitting oscillator, and the diodes 4, 4' are used as a modulator. The driver stage 6 controls the bias of the diodes according to the desired modulation. The modulated signals are added in the coupler and fed to the antenna 3. Antenna and oscillator must be isolated from each other. This is achieved by isolating the coupler and inserting an isolator or attenuator (not shown in FIG. 1) between the coupler and the oscillator.

When receiving, the oscillator 1 works as a local oscillator, and the diodes 4, 4' are used as a mixer. In the IF amplifier stage 5, the IF signal is preamplified. The signal received by the antenna 3 is divided by the coupler 2 between the two diodes 4, 4'.

The modulator and the mixer thus form a unit. Suitable diodes are Schottky diodes.

This circuit can be implemented particularly advantageously using the fin-line technique. The transmitter-receiver module can then be of a highly compact, rugged, and electrically stable design.

In fin-line technology, which is known per se, wave propagation takes place in a waveguide containing a dielectric substrate on which metal fins are deposited. The propagation pattern is determined essentially by the fins.

For the sake of clarity, the oscillator, the coupler, the mixer-modulator, and the antenna will be described separately. However, these units all have inputs and outputs implemented in fin-line form, so that they can be easily interconnected.

Figure 2:
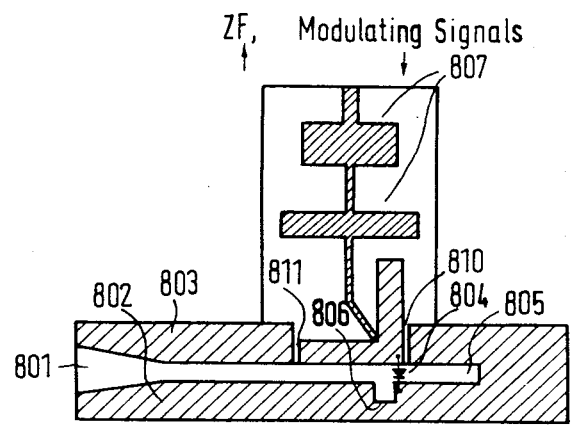
FIG. 2 shows an embodiment of a mixer-modulator for the transmitter-receiver module.

First, the mixer-modulator 4 will be explained with the aid of FIG. 2. The figure shows only the arrangement for one of the diodes. The arrangement for the other diode is identical.

Two fins 802, 803, deposited on a substrate form a slot 801, which slightly widens to the left. At this point, the mixer-modulator is connected to the coupler. The widening serves to match the impedance of the arrangement to the coupler (if the impedances are equal, no widening is required).

To obtain a perfect match (real component and imaginary component), the slot of the fin line has a recess 806, which is dimensioned in a manner known to the person skilled in the art. Located behind this recess 806 is the Schottky diode 804; it is connected to the two fins 802, 803 of the fin line. The slot extends a given distance 805 beyond the Schottky diode 806 and presents at its end a short circuit to the wave propagation.

The IF signal is coupled out via a stripline 807 designed as a low-pass filter. The stripline is electrically connected to the fin 803. On both sides of the point of connection, the fin 803 has slots 810, 811, which provide electrical isolation between the two diode terminals. The slots are so narrow that they have no appreciable effect on the wave propagation in the fin-line plane. What was said on the extraction of the IF signal applies analogously to the feeding of the modulating signals.

The mixer-modulator works as follows: A Schottky diode is, to a first approximation, a purely resistive component. The reactive components of its impedance, which are caused by the package and the depletion-layer capacitance, are eliminated by the short-circuited stub 805 behind the diode 804. At zero or slightly negative bias, the diode is relatively highly resistive. When used as a modulator, it absorbs the incident power, so that practically no reflected wave is caused. If the diode is biased positively, its effective resistance decreases. Thus, the total RF power is reflected when the diode is used as a modulator.

In the mixer mode, half of the received signal and of the local-oscillator signal is applied to each of the diodes 4 and 4'. The IF signals provided by the diodes are fed to IF amplifier stage 5.

For the mixer-modulator, a supply network (not shown) is required which is not realized in fin-line form. It passes the generated IF signals to the IF amplifier stage, and the modulating signals to the diodes.

Figure 3:
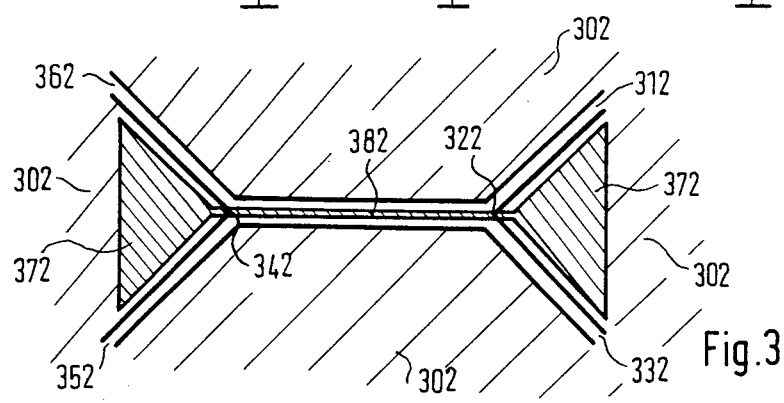
FIG. 3 shows an embodiment of a coupler for the transmitter-receiver module.

The 3dB coupler will now be explained with the aid of FIG. 3. It is designed on the basis of branch-line couplers.

The fin line of the coupler is unilateral, i.e., metal fins 302 are deposited on only one side of the substrate. The fins are marked in the drawing by a hatching from the lower left to the upper right. They form slots 312, 332, 352 and 362.

The slot between the points 322 and 342, at each of which two unilateral fin lines meet, is not a fin-line slot as far as its electrical behavior is concerned, but it actually forms a slotted line.

The fin line described represents a coupler only if supplemented with suitably arranged quasi-lumped elements. Suitable elements of this kind are:

a length of wire (not shown in FIG. 3) which is bonded to the fins at the points 322 and 342 and, thus, interconnects these two points. It has the shape of U whose legs are perpendicular to the surface of the fins and connected to these points. The portion of the length of wire which is parallel to the surface of the fins is to be spaced as far as possible from the fins so as to influence the electric field of the fin line as little as possible. Its optimum length is determined by the necessary 90° phase difference between the two coupling arms 312, 332.

a stripline 382 disposed on the side of the substrate opposite the fins. It extends above the slot between the points 322 and 342. To the side of each of these points, the stripline expands into a metal surface 372. These metal surfaces and the fins on the other side of the substrate provide capacitive coupling. The length of the stripline determines the decoupling. The stripline will qenerally run in a serpentine rather than a straight course in order to provide the 90° phase difference as in the previous case. For this reason, and since the capacitive coupling influences the electrical length of the stripline, the latter can be given a desired electrical length. Care must be taken to ensure that the stripline is positioned so as not to influence the electric field of the fin line as far as possible, and not to form a bilateral fin line.

The coupling ratio, i.e., the ratio in which the energy supplied over a fin line is divided between the two fin lines over which this energy is passed on, will depend, inter alia, on how far the fin lines are longitudinally displaced relative to each other.

The coupler has four fin-line terminals, the two right-hand terminals being connected to the fin lines of the mixer-modulator, which are formed by the fins 802, 803, the slot 801, and the waveguide (not shown). The two lefthand terminals are connected to the antenna 3 and the oscillator 1, respectively.

Embodiments of oscillators will now be described with the aid of FIGS. 4a to 7.

Figure 4A:
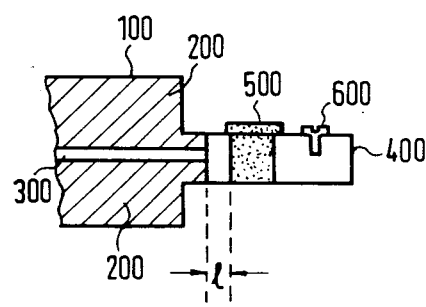

In the cross-sectional view of FIG. 4a, the waveguide 100 housing the fin line and the fins 200 deposited on the substrate are shown in the left-hand portion. The fins leave a slot 300 on the substrate. Connected with the waveguide 100 is a cutoff waveguide 400. Cutoff waveguides are waveguides operated in their cutoff regions, i.e., the cross section of the waveguide is chosen so that the waveguide cutoff frequency lies above the desired frequency of the oscillator. The fins 200 project a short distance into the cutoff waveguide.

The diode package 500, which contains the diode, is mounted in the cutoff waveguide in a manner known per se. To realize a given capacitance, the cutoff waveguide 400 contains a tuning screw 600, which, together with the package, provides a defined capacitance.

In the embodiment, the fin line is a unilateral fin line. The fins are symmetrical with respect to the slot. It is also possible to use other fin lines, e.g., a fin line where the slot is formed by only one fin and the wall of the waveguide.

Figure 4B:
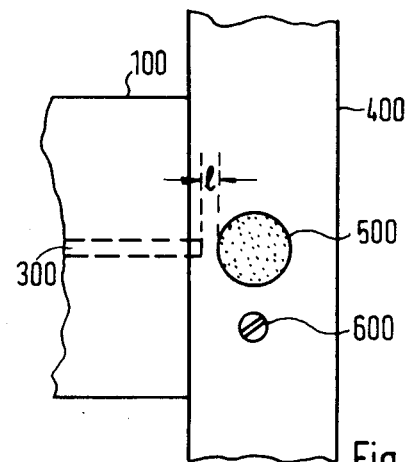

FIG. 4b shows this arrangement in a top view. The same reference characters as in FIG. 4a are used.

The fin-line oscillator works as follows:

In the equivalent circuit, the cutoff waveguide is represented by a pure inductance. Therefore, no undesired resonance effect can result from the incorporation of the active element. No wave propagation takes place in the region of the cutoff waveguide, so that the equivalent inductance can be regarded as a lumped circuit element. The width of the cutoff waveguide is chosen so that the desired frequency of oscillation is approximately ⅔ or less of the frequency of the dominant wave. Then, the equivalent inductance of the cutoff waveguide is nearly frequency-in-dependent.

To generate the desired frequency, the complementary energy store, i.e., a capacitance, must be added. In the equivalent circuit, the point of extraction i.e., the abrupt transition from the fin-line slot to the cutoff waveguide, represents a shunt capacitance. However, this capacitance is quite small because the metal fins are very thin (approx. 17.5 μm to approx. 35 μm). This does not suffice to compensate for the inductive reactance of the cutoff waveguide. An additional, larger capacitance is realized by the tuning screw in the cutoff waveguide. This also permits the frequency of the oscillator to be varied mechanically. The cutoff waveguide need not necessarily be closed metallically in its right-hand portion, because only aperiodically damped modes can exist there.

After this description of the frequency adjustment it will be described how tuning to the load is accomplished. To do this, the negative equivalent resistance of the active element must be matched to the load. The remaining degrees of freedom are, on the one hand, the slot width of the fin line and, on the other hand, the distance 1 between the end of the fin line and the package of the active element. This permits perfect matching in any case.

The supply voltage for the diode may be applied either through a coaxial low-pass filter in a manner known per se or—and this solution is very well suited to the structure—through a thin wire running from the open end of the cutoff waveguide to the diode. This open end must then be plugged with a damping material so that no radio-frequency power can escape there. This reduces the ouput power only negligibly (typically by 0.2 dB), while two additional advantages are gained: on the one hand, it increases the certainty of the start of oscillations, and on the other hand, the harmonic content of the output spectrum is reduced by typically 10 dB. If no mechanical tunability of the oscillator is desired, in a modification of the circuit, the tuning screw may be replaced with a metallic strip which is produced on a dielectric substrate material using a photoetching technique. To this end, one must imagine that in FIG. 4a, the dielectric substrate, on which the fins are deposited in the left-hand portion is also present to the right of the active element. By etching away the unwanted portion of the copoer cladding, a longitudinal, metallic strip can be formed which, if it is of suitable length and height, represents a capacitance. Thus, a purely planar structure has been realized, and the diode has been built in at low cost, in a reproducible manner, and with a good heat sink.

The oscillator can advantageously be made electronically tunable by adding a varactor diode. This may be done in two ways. A varactor diode in a normal package (e.g., S 4 package) may be fitted into the cutoff waveguide instead of or in addition to the tuning screw. The mounting is thus similar to that of the active element. A second possibility is to bond a varactor diode in a beam-lead package directly above the fin-line slot at a suitable point. Along the slot, points can be found where the varactor diode is coupled so closely that the electronic tuning range is of the order of percents.

Then, however, the output power decreases by 1 to 3 dB. At other points, the coupling is only weak, so that a tuning range of the order of 3% of the rated frequency can be realized virtually without loss of output power.

Another embodiment will now be explained with the aid of FIG. 5a. Here, the diode package is mounted not in a waveguide but in the substrate on which the fins of the fin line are deposited.

Figure 5A:
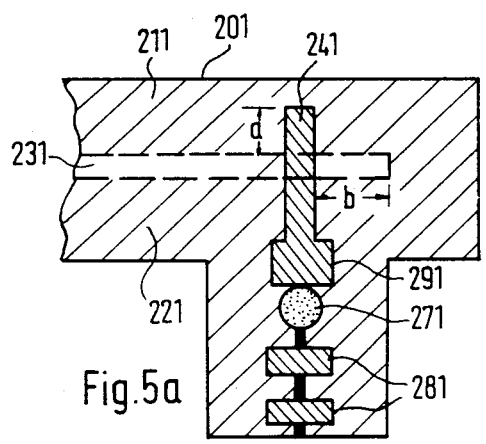

In the schematic representation of FIG. 5a, metal films are deposited on the top and bottom sides of a dielectric substrate (not shown). The metal film on the bottom side of the substrate is indicated by a hatching from the lower left to the upper right, and that on the top side by a hatching from the upper left to the lower right.

On the bottom side of the substrate, the fins 211, 221 of the fin line form a slot 231. The substrate and the fins are enclosed in a waveguide 201. On the other side of the substrate and perpendicular to the direction of the slot, a stripline 241 is deposited on the substrate. It extends a distance a beyond the slot and is spaced a distance b from the end of the slot.

The diode package 271 is mounted in a hole in the substrate and electrically connected to the stripline 241. The supply voltage for the diode is applied through a stripline lowpass filter 281.

In this arrangement, the stripline is coupled to the fin line via a strip-slot transition. If suitable lengths a and b are chosen, this transition represents a resonant circuit which determines the frequency. The matching of the real component of the diode impedance is accomplished by choosing a suitable value for the impedance of the fin line, i.e., by choosing a suitable slot width, and by means of a quarter-wave transformer 291 on the stripline directly in front of the diode. In this manner, the rated power of the active element can be coupled out at a frequency determined by a and b.

Figure 5B:
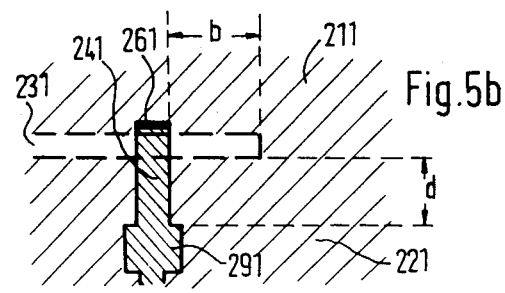

A development of this solution is shown in FIG. 5b. In the arrangement of FIG. 5b, the length a is chosen to be very small, and the stripline is connected to the metal fin 211 on the other side of the substrate by a plated-through hole 261. In this case, the frequency-determining resonant circuit is determined by the length b (distance of the stripline from the end of the slot) and the distance d of the quarter-wave transformer 291 from the fin-line slot 231. The real component of the diode impedance is matched to the load in the same manner as in the embodiment of FIG. 5a.

Finally, a few remarks on the performance of the oscillator. With all structures it is possible to couple out the rated power of the diode. The external Q and, thus, the bandwidth are comparable with the values achieved using conventional waveguide techniques. Hence, noise is similarly low. The electronic tuning range of the first structure is typically 5 to 10%.

It was described which parameters form a resonant circuit or determine the frequency, and which parameters must be chosen to match the diode to the load. With this knowledge, those skilled in the art will be able to determine the actual lengths in any concrete case, so that this need not be described here.

The operation of the latter two embodiments of an oscillator which is particularly suitable for implementation in finline form will now be explained with the aid of FIGS. 6 and 7.

A coupler 403 with four terminals 203, 303, 703, 803 is common to both embodiments. A suitable coupler is the one explained with the aid of FIG. 3. In the embodiment of FIG. 6 the terminal connected to the oscillator terminal of the coupler 2 (FIG. 1) is the terminal 303; in the embodiment of FIG. 7, this terminal is the terminal 203.

Connected to two further terminals 703 and 803 of the coupler 403 (FIGS. 6, 7) are varactor diodes 503 and 603, respectively. One of the varactor diodes, 503, is used to adjust the frequency of the oscillator, and the other 603, the output power. If no tunability or no modulation is desired, a bias is applied to the two varactor diodes to obtain the desired values. If the oscillator is to be continuously tunable or capable of being modulated, the biases applied to the varactor diodes will be suitably changed to control the frequency or the output power.

By the choice of the coupling ratio, the sensitivity of the control parameters, i.e., the sensitivity of the frequency and amplitude adjustment, can be adjusted.

As the two biases for the two diodes can be controlled independent of each other, there is no interaction between the frequency adjustment and the power adjustment.

An active two-terminal device is connected to another terminal 203 of the coupler. A suitable active device is a Gunn diode.

Figure 1:
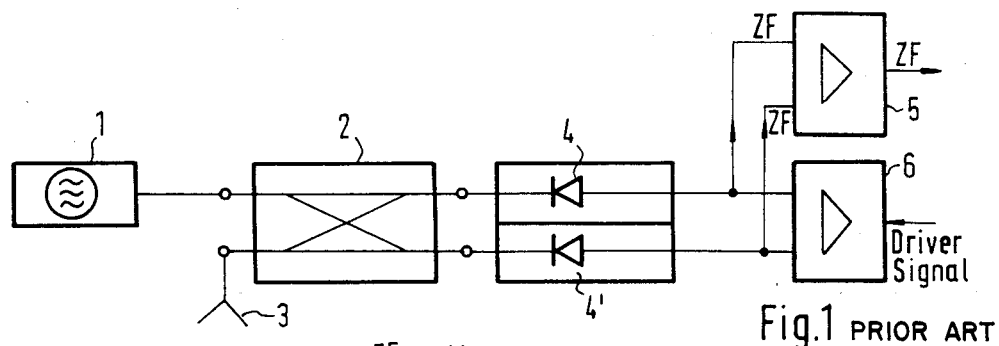
FIG. 1 is a block diagram of the known transmitter-receiver module.

In the first embodiment, shown in FIG. 6, the fourth terminal 303 of the coupler is the output A of the oscillator, i.e., it is connected to the coupler 2 (FIG. 1)

In the second embodiment, shown in FIG. 7, the fourth terminal 303 of the coupler 403 is terminated with an impedance 103. The impedance Zo is chosen to be equal to the characteristic impedance of the coupler. In this case, the terminal 203 of the coupler 403 not only is connected to the active two-terminal device but also represents the output A of the oscillator, i.e., it is connected to the coupler 2 (FIG. 1).

The diodes may be connected to the fin lines of the coupler as explained with the aid of FIGS. 4 and 5 or, if no package is provided for them, bonded directly to the fins.

This circuit is suitable for different applications. It can be readily adapted to meet specific requirements. In special radar sets, for example, switches are inserted between the coupler 2 and the diodes or the oscillator. This is realized with further fin lines containing switchable diodes. To implement the antenna, the slot of the fin line of the coupler is flared out into the shape of a horn (Vivaldi structure). The other design factors are the same as those for conventional waveguide antennas.

I claim:

1. A transmitter-receiver module providing an IF signal when receiving, and a transmitter signal when transmitting, and including an antenna, an oscillator used as a signal source during transmitting and as a local oscillator during receiving, a coupler having four terminals one of which is connected to the oscillator, another one to the antenna, and each of the remaining two to one diode, the two diodes being used as a modulator during transmitting and as a mixer during receiving, characterized in that the oscillator, the coupler, and the mixer-modulator are implemented in fin-line form, that the fin-line oscillator contains a diode housed in a package (500) and used as an active element, and an impedance matching network for matching the diode to a load and determining the frequency, that a waveguide (100) containing the fin line is connected with a cutoff waveguide (400), that the the fin line includes fins (200) which extend into the cutoff waveguide (400) and have respective spaced ends, that the diode package (500) is disposed in the cutoff waveguide and electrically connected to one of the top and bottom sides of the cutoff waveguide, and that one of a suitable distance (l) between the fin ends and the diode package and a suitable width of a slot between the fins is chosen, as well as a suitable value of capacitance in the cutoff waveguide is chosen to determine the frequency and match the diode to the load.

2. A transmitter-receiver module providing an IF signal when receiving, and a transmitter signal when transmitting, and including an antenna, an oscillator used as a signal source during transmitting and as a local oscillator during receiving, a coupler having four terminals one of which is connected to the oscillator, another one to the antenna, and each of the remaining two to one diode, the two diodes being used as a modulator during transmitting and as a mixer during receiving, characterized in that the oscillator, the coupler, and the mixer-modulator are implemented in fin-line form, that the fin-line oscillator contains a diode housed in a package (500) and used as an active element, and an impedance-matching network for matching the diode to a load and determining the frequency, that the diode package (271) is mounted in a substrate on which fins (211, 221) of the fin line are deposited, that a stripline (241) is deposited on the side of the substrate opposite the fins and at approximately right angles to a slot (231) formed by the fins, and that the diode package (271) is electrically connected to the stripline (241).

3. A transmitter-receiver module as claimed in claim 2, characterized in that the stripline (541, FIG. 5b) reaches beyond the slot (231) of the fin line to such a poiht that the stripline (241, 261) is electrically connectable to the fin (211) on the opposite side of the substrate, that such a connection (261) is present, that the stripline forms a quarter-wave transformer (291) at a given distance (d) from the slot (231), and that this given distance (d), the distance (b) of the stripline (241) from the end of the slot, and the slot width of the fin line are chosen in accordance with the desired frequency and the impedance of the load.

4. A transmitter-receiver module as claimed in claim 2, characterized in that the stripline (241, FIG. 5a) reaches a given distance (a) beyond the slot (231), and that this given distance (a), the distance (b) of the stripline from a end of the slot, and the slot width of the fin line are chosen in accordance with the desired frequency and the impedance of the load.

5. A transmitter-receiver module providing an IF signal when receiving, and a transmitter signal when transmitting, and including an antenna, an oscillator used as a signal source during transmitting and as a local oscillator during receiving, a coupler having four terminals one of which is connected to the oscillator, another one to the antenna, and each of the remaining two to one diode, the two diodes being used as a modulator during transmitting and as a mixer during receiving, characterized in that the oscillator, the coupler, and the mixer-modulator are implemented in fin-line form, that the fin-line oscillator for electromagnetic waves contains a two-terminal device (103) as an active element, and an impedance-matching network (403) for matching the two-terminal device to a load (A), that the impedance-matching network is formed by a coupler (403) having four terminals (203, 303, 703, 803), that two of the terminals (703, 803) are terminated with impedances (503, 603) for adjusting/continuously varying the output power and the frequency, that another of the terminals (203) is connected to the active two-terminal device (103), and that the fourth terminal (303) is the oscillator output.

6. A transmitter-receiver module providing an IF signal when receiving, and a transmitter signal when transmitting, and including an antenna, an oscillator used as a signal source during transmitting and as a local oscillator during receiving, a coupler having four terminals one of which is connected to the oscillator, another one to the antenna, and each of the remaining two to one diode, the two diodes being used as a modulator during transmitting and as a mixer during receiving, characterized in that the oscillator, the coupler, and the mixer-modulator are implemented in fin-line form, that the fin-line oscillator for electromagnetic waves contains a two-terminal device (103) as an active element and an impedance-matching network (403) for matching the two-terminal device to a load A, that the impedance-matching network is formed by a coupler (403) having four terminals (203, 303, 703, 803), that two of the terminals (703, 803) are terminated with impedances for adjusting/continuously varying the output power and the frequency, that another of the terminals (303) is terminated with a further impedance (103) equal to the characteristic impedance of the coupler, and that the fourth terminal (203) is connected to the two-terminal device (103) on one side and to the oscillator outpput (A) on the other.

7. A transmitter-receiver module providing an IF signal when receiving, and a transmitter signal when transmitting, and including an antenna, an oscillator used as a signal source during transmitting and as a local oscillator during receiving, a coupler having four terminals one of which is connected to the oscillator, another one to the antenna, and each of the remaining two to one diode, the two diodes being used as a modulator during transmitting and as a mixer during receiving, characterized in that the coupler is a branch-line coupler, that the oscillator, the coupler, and the mixer-modulator are implemented in fin-line form, that the coupler is formed on a substrate by means of a unilateral fin line (302, 312, 332, 352, 362) which includes four fin lines connected to coupler terminals and interconnected by a length of line which represents a slotted line in its structure but is so short that the parameters required for wave propagation along slotted lines are not met, that the stripline (382) is provided on the side of the fin-line substrate opposite the slotted line, and that at points (372) where the fin lines diverge on the opposite side of the substrate, the stripline widens so as to be capacitively coupled with the fin lines.

* * * * *